(12) United States Patent
Taguchi

(10) Patent No.: US 6,339,247 B1
(45) Date of Patent: Jan. 15, 2002

(54) STRUCTURE FOR MOUNTING A SEMICONDUCTOR DEVICE ON A LIQUID CRYSTAL DISPLAY, AND SEMICONDUCTOR DEVICE

(75) Inventor: Noboru Taguchi, Sayama (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/646,537
(22) PCT Filed: Jan. 20, 1999
(86) PCT No.: PCT/JP99/00184
§ 371 Date: Sep. 19, 2000
§ 102(e) Date: Sep. 19, 2000
(87) PCT Pub. No.: WO00/43834
PCT Pub. Date: Jul. 27, 2000
(51) Int. Cl.[7] ............................................. H01L 31/0203
(52) U.S. Cl. ....................... 257/433; 257/257; 257/692; 257/693
(58) Field of Search .................. 257/433, 692, 257/693

(56) References Cited

U.S. PATENT DOCUMENTS 5,808,357 A * 9/1998 Sakoda et al.
6,147,400 A * 11/2000 Faraci et al.
6,150,716 A * 11/2000 MacQuarrie et al.
6,207,475 B1 * 3/2001 Lin et al.

* cited by examiner

Primary Examiner—Stephen D. Meier
(74) Attorney, Agent, or Firm—Armstrong, Westerman, Hattori, McLeland & Naughton, LLP

(57) ABSTRACT

On a liquid crystal display device (80) comprising a first substrate (81) and a second substrate (82) with electrodes (83, 84), formed thereon, respectively, and liquid crystal (85) sealed thereinbetween, a semiconductor device (1) for driving the liquid crystal display device (80) is mounted. The semiconductor device (1) is provided with a plurality of bumps (24), each electrically conductive with respective electrode pads provided on the upper surface of a semiconductor chip (12) with an integrated circuit formed thereon, through the intermediary of respective lower electrodes, provided so as to stretch over the upper surface and two sidewall faces of the semiconductor chip (12), respectively. The semiconductor device (1) is mounted on the surface of a part of the first substrate (81) of the liquid crystal display device (80) where the first substrate (81) is extended beyond an edge of the second substrate (82) such that one of the sidewall faces of the semiconductor chip (12) is opposite thereto, thereby connecting the bumps (24) to the electrodes (83) formed on the first substrate (81), respectively. The other of the sidewall faces of the semiconductor chip (12) is connected with an end portion of an FPC (60). As a result, an area of junctions can be lessened, thereby achieving downsizing of the liquid crystal display device.

10 Claims, 7 Drawing Sheets

US 6,339,247 B1

STRUCTURE FOR MOUNTING A SEMICONDUCTOR DEVICE ON A LIQUID CRYSTAL DISPLAY, AND SEMICONDUCTOR DEVICE

TECHNICAL FIELD

This invention relates to a structure for mounting a semiconductor device for driving a liquid crystal display device on a substrate of the liquid crystal display device for electrical and mechanical connection therebetween, and the semiconductor device for implementing such a structure, particularly, to a surface-mounting type semiconductor device provided with bumps (protruded electrodes) for electrical connection with the liquid crystal display device.

BACKGROUND TECHNOLOGY

Surface-mounting type semiconductor devices have come into widespread use as a semiconductor device making up an integrated circuit (IC), a large scale integrated circuit (LSI), and so forth.

Among the surface-mounting type semiconductor devices, there is one type provided with a multitude of bumps placed in lines on the upper surface thereof for electrical and mechanical connection with a wiring pattern on a circuit board when mounting the same on the circuit board. FIG. 15 shows the cross-sectional construction of a semiconductor device provided with bumps formed in a straight-wall shape by way of example.

With this semiconductor device, a multitude of electrode pads 74 for connection with an external circuit are provided along side edges of a semiconductor chip 72, running in a direction orthogonal to the plane of the figure, on the surface (the upper face in the figure) of the semiconductor chip 72 with an integrated circuit (not shown) formed thereon. In FIG. 15, only one of a plurality of the electrode pads 74, 74, disposed in respective lines along the side edge on both sides of the semiconductor chip 72, is shown.

An insulating film 76 having openings formed in such a way as to cover a peripheral region of the respective electrode pads 74, and to mexpose the inside of the respective peripheral regions is provided on the entire upper surface of the semiconductor chip 72, and a lower electrode 79 is provided so as to be in intimate contact with the peripheral region of the respective openings of the insulating film 76, and an exposed part of the respective electrode pads 74. Further, on top of the respective lower electrodes 79, bumps 78 formed in a straight-wall shape are provided.

Thus, the semiconductor device is provided with the bumps 78 formed in a straight-wall shape. In contrast, there is another type of semiconductor device provided with bumps formed in a mushroom shape, wherein the top part of the bumps is larger than the base thereof. However, the semiconductor device provided with the bumps formed in a straight-wall shape is more suitable for reducing lateral spread thereof, along a semiconductor substrate 72, and to that extent, a placement density of the bumps can be rendered higher, so that a connection pitch with the external circuit can be miniaturized.

Such surface-mounting semiconductor devices provided with the bumps as described have come to be used as semiconductor devices for driving a liquid crystal display device, and a plurality of such semiconductor devices for use in driving (scanning and inputting signals) have come to be mounted on a peripheral region of a glass substrate making up a liquid crystal panel of the liquid crystal display device.

Accordingly, a conventional structure for mounting a semiconductor device on such a liquid crystal display device is described hereinafter with reference to FIG. 16 by way of example.

Reference numeral 80 denotes a liquid crystal display device wherein liquid crystal 85 is sealed in-between a first substrate 81 and a second substrate 82, making up a liquid crystal panel, by use of a sealing material 86, and a region 8 of the first substrate 81 where the first substrate 81 is extended beyond an edge of the second substrate 82 is a region where a semiconductor device 71 for driving the liquid crystal display device 80 is mounted. For the first and second substrates 81, 82, respectively, a glass substrate is generally used, however, a transparent resin substrate, or the like may be used as well.

A multitude of scanning electrodes 83 extending to the region 8 from the interior of the liquid crystal display panel with the liquid crystal 85 sealed therein, and a multitude of terminal electrodes 88 serving as connecting terminals to the external circuit are composed of a transparent and electrically conductive film, and are patterned on the upper surface of the first substrate 81 in such a way as to be placed in lines across the direction orthogonal to the plane of the figure. A multitude of signal electrodes 84 are composed of a transparent and electrically conductive film, and are patterned on the inner surface of the second substrate 82, opposite to the scanning electrodes 83 across the liquid crystal 85, in such a way as to be placed in lines across the transverse direction in the figure.

An anisotropic conductive adhesive 50 composed of electrically conductive particles 52 dispersed in an insulating adhesive is applied onto the region 8 of the first substrate 81 of the liquid crystal display panel 80. Then, the semiconductor device 71 in a posture inverted from that shown in FIG. 15 is disposed on the region 8 of the first substrate 81 after alignment of the respective bumps 78 with the respective scanning electrodes 83 and the respective terminal electrodes 88 that are to be connected with the respective bumps 78.

With the semiconductor device 71 being set on the first substrate 81 with the anisotropic conductive adhesive 50 applied thereon as described above, pressure is applied to the semiconductor device 71 against the first substrate 81, and at the same time, heat treatment is applied thereto, thereby electrically connecting the respective bumps 78 with the respective scanning electrodes 83 and the respective terminal electrodes 88 through the intermediary of the electrically conductive particles 52 contained in the anisotropic conductive adhesive 50. Concurrently, the semiconductor device 71 is bonded to, and securely mounted on the first substrate 81 by the insulating adhesive contained in the anisotropic conductive adhesive 50.

Further, an end of a flexible printed circuit board (FPC) 60 is disposed on a part of the upper surface of the first substrate 81 where the terminal electrodes 88 are formed. A wiring pattern (not shown) composed of a copper foil, for providing the semiconductor device 71 with a power supply source and input signals, is formed on the FPC 60.

The wiring pattern is also electrically connected with the respective terminal electrodes 88 on the first substrate 81 through the intermediary of the electrically conductive particles 52 contained in the anisotropic conductive adhesive 50, and at the same time, the end of the FPC 60 is bonded to, and securely mounted on the first substrate 81.

By mounting the semiconductor device 71 in the manner as described above, the electrically conductive particles 52 contained in the anisotropic conductive adhesive 50 are securely held between the respective bumps 78 and the respective scanning electrodes 83 on the first substrate 81 as well as between the wiring pattern on the FPC 60 and the respective terminal electrodes 88 on the first substrate 81, thereby attaining electrical connection, respectively, and also attaining mechanical connection therebetween, respectively, by the insulating adhesive.

Thereafter, a mold resin 62 is applied to the upper surface of junctions for both the semiconductor device 71 and the FPC 60, as well as peripheral regions thereof. This can prevent moisture from ingressing into junctions between the respective bumps 78 and the respective scanning electrodes 83 as well as junctions between the FPC 60 and the respective terminal electrodes 88 while providing these junctions with mechanical protection, so that reliability of the structure for mounting the semiconductor device can be enhanced.

However, a problem has been encountered with such a conventional structure of mounting the semiconductor device on a liquid crystal display device, that is, an area occupied by those junctions (the region 8 shown in FIG. 16) requires a fairly large size, thus interfering with an aim of downsizing the liquid crystal display device.

For example, the region 8 representing a junction area for joining both the semiconductor device 71 and the FPCs 60 with the liquid crystal display device 80 was found to be about 5 mm in width since it was necessary to take into account 2 mm as a width of the semiconductor device 71, 1 mm as connection allowance for the semiconductor device 71, and 2 mm as connection allowance for the FPC 60.

The region 8 of the liquid crystal display device 80, in which the semiconductor device is mounted, represents non-display sections of the liquid crystal panel, so that a module size of the liquid crystal panel has come to represent a fairly large proportion relative to a display section area.

DISCLOSURE OF THE INVENTION

The invention has been developed to solve the problem described above, and it is therefore an object of the invention to realize downsizing of a liquid crystal display device by reducing an area of a part of the liquid crystal display device, for mounting a semiconductor device on a circuit board thereof, including a part of the liquid crystal display device, for connecting a flexible printed circuit board to the semiconductor device. To this end, the invention provides a structure for mounting a semiconductor device on a liquid crystal display device, and the semiconductor device for implementing the structure.

More specifically, with a structure for mounting a semiconductor device on a liquid crystal display device according to the invention, the semiconductor device provided with bumps electrically conductive with electrode pads formed on a semiconductor chip with an integrated circuit formed thereon, respectively, through the intermediary of respective lower electrodes, formed so as to stretch over both the surface (upper surface) and a sidewall face of the semiconductor chip, is mounted on the liquid crystal display device comprising a first substrate provided with scanning electrodes formed thereon, a second substrate provided with signal electrodes formed thereon opposite to the scanning electrodes, and liquid crystal sealed therein-between. Further, the semiconductor device is mounted on the surface of a part of either of the first substrate and the second substrate, where one of the substrates is extended beyond an edge of the other substrate, such that one sidewall face of the semiconductor chip is opposite the surface, so that the bumps disposed on the side are connected to the electrodes formed on one of the substrates, respectively.

The bumps of the semiconductor device are preferably provided so as to stretch over both the surface (upper surface) and a second sidewall face of the semiconductor chip opposite from a first sidewall face thereof as well as both the upper surface and the first sidewall face, and the semiconductor device is preferably mounted on the surface of the part of either of the first substrate and the second substrate, where one of the substrates is extended beyond the edge of the other substrate, such that the first sidewall face of the semiconductor chip is opposite the surface, so that the bumps stretching over the first sidewall face are connected to the electrodes formed on said one of the substrates, respectively, while a flexible printed circuit board is connected to the second sidewall face of the semiconductor chip, so that a wiring pattern (printed wiring) of the flexible printed circuit board is rendered electrically conductive with the bumps stretching over the second sidewall face.

Otherwise, the bumps of the semiconductor device may be provided so as to stretch over both the surface (upper surface) and a third sidewall face of the semiconductor chip orthogonal to a first sidewall face thereof as well as both the upper surface and the first sidewall face, and the semiconductor device is mounted on the surface of the part of either of the first substrate and the second substrate, where one of the substrates is extended beyond the edge of the other substrate, such that the first sidewall face of the semiconductor chip is opposite the surface, so that the bumps stretching over the first sidewall face are connected to the electrodes formed on said one of the substrates, respectively, while a flexible printed circuit board is connected to the third sidewall face of the semiconductor chip, so that a wiring pattern (printed wiring) of the flexible printed circuit board is rendered electrically conductive with the bumps stretching over the third sidewall face.

Further, a semiconductor device according to the invention is a semiconductor device to be mounted on the liquid crystal display device comprising a first substrate provided with scanning electrodes formed thereon, a second substrate provided with signal electrodes formed thereon, opposite to the scanning electrodes, and liquid crystal sealed therein-between, for driving the liquid crystal display device, comprising: a semiconductor chip provided with an integrated circuit formed thereon with a plurality of electrode pads for connecting the integrated circuit to an external circuit, disposed in the vicinity of side edges of the upper surface thereof; an insulating film formed on the semiconductor chip, having an opening for exposing the respective electrode pads; a lower electrode provided on the respective electrode pads; and a plurality of bumps, each electrically conductive with the respective electrode pads through the intermediary of the respective lower electrodes, provided so as to stretch over both the surface (upper surface) and respective sidewall faces of the semiconductor chip.

The sidewall faces of the semiconductor chip, along which the bumps are provided, respectively, are preferably formed in a setback shape with a difference in level, provided on the side of the surface (upper surface) of the semiconductor chip.

Further, it is desirable that the bumps are provided so as to protrude sideways from the respective sidewall faces of the semiconductor chip. In the case where the sidewall faces of the semiconductor chip are formed in the setback shape with the difference in level, the bumps are preferably provided so as to protrude sideways from the outermost face of the respective sidewall faces.

Further, the bumps are preferably composed of a plurality of metallic layers composed of, for example, a copper layer and a gold layer, or a copper layer, a nickel layer, and a gold layer, deposited in this order from the lower electrode side.

BEST MODE FOR CARRYING OUT THE INVENTION

Figure 2:
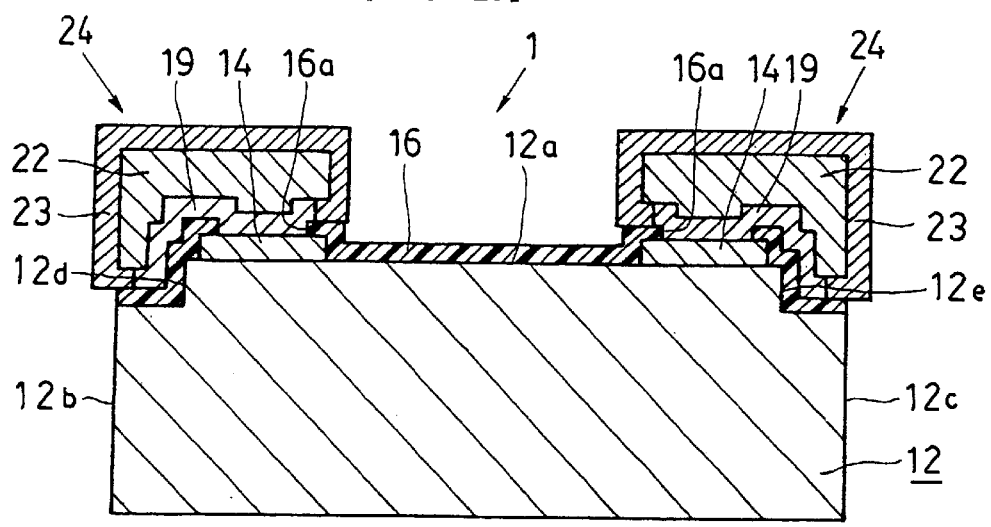
FIG. 2 is a sectional view showing an embodiment of a semiconductor device to be mounted on a liquid crystal display device according to the invention.

Preferred embodiments of a structure for mounting a semiconductor device on a liquid crystal display device, and a semiconductor device for implementing the structure, according to the invention, are described hereinafter with reference to the accompanying drawings.
Construction of a Semiconductor Device: FIG. 2

First, an embodiment of a semiconductor device to be mounted on a liquid crystal display device, according to the invention, is described hereinafter with reference to FIG. 2.

FIG. 2 is a sectional view showing the construction of a surfacemounting type semiconductor device according to the invention, which is to be mounted on a liquid crystal display device for driving the liquid crystal display device.

The semiconductor device 1 comprises a semiconductor chip 12 provided with an integrated circuit (not shown in the figure) formed thereon, and electrode pads 14 for connecting the integrated circuit to an external circuit, disposed in the vicinity of side edges (in this example, an edge of sidewall faces 12b, 12c, on opposite sides of the semiconductor chip 12, respectively, running in a direction orthogonal to the plane of the figure) of a surface (upper surface) 12a thereof; an insulating film 16 formed on the semiconductor chip 12, having an opening 16a for exposing respective electrode pads 14; a lower electrode 19 provided on top of the respective electrode pads 14, and bumps 24, each electrically conductive with the respective electrode pads 14 via the respective lower electrodes 19, provided so as to stretch over both the upper surface 12a of the semiconductor chip 12 and the first sidewall 12b or the second sidewall 12c, opposite the first sidewall 12b.

The sidewall faces 12b, 12c of the semiconductor chip 12, along which the bumps 24 are provided, respectively, are formed in a setback shape with a difference in level (steps 12d, 12e), provided on the side of the upper surface 12a, and the lower electrode pad 19 is extended from the respective electrode pads 14 along the step section, with the respective bumps 24 being formed in such a way as to overlie the respective lower electrodes 19.

The sidewall face of the respective bumps 24 are protruded sideways to the extent of 1 to 10 μm from the sidewall face 12b or 12c of the semiconductor chip 12, that is, the outermost face of the respective sidewall faces having the difference in level. The bumps 24 are composed of two metallic layers, namely, an inner bump 22 formed of a copper (Cu) layer, and an outer bump 23 formed of a gold (Au) layer.

Figure 1:
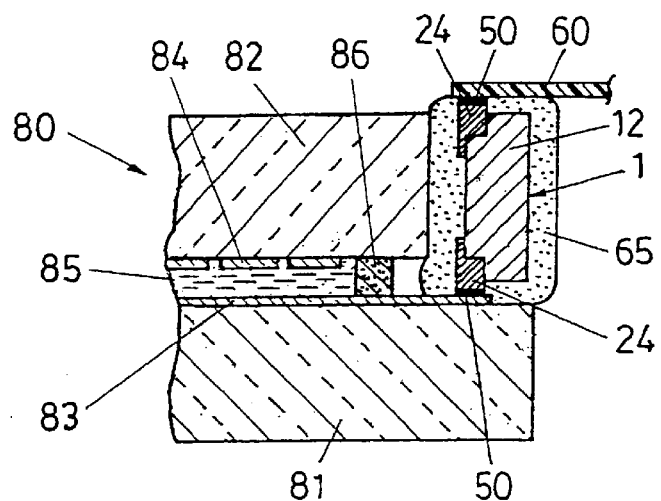
FIG. 1 is a sectional view showing an embodiment of a structure for mounting a semiconductor device on a liquid crystal display device according to the invention.

In this connection, the bumps 24 may be composed of a single metallic layer insusceptible to oxidation such as a gold, or may be composed of three layers consisting of a copper layer, a nickel layer, and a gold layer, or so forth.
Structure for Mounting the Semiconductor Device: FIG. 1

The structure wherein the semiconductor device is mounted on a liquid crystal display device is described hereinafter with reference to FIG. 1.

Figure 16:
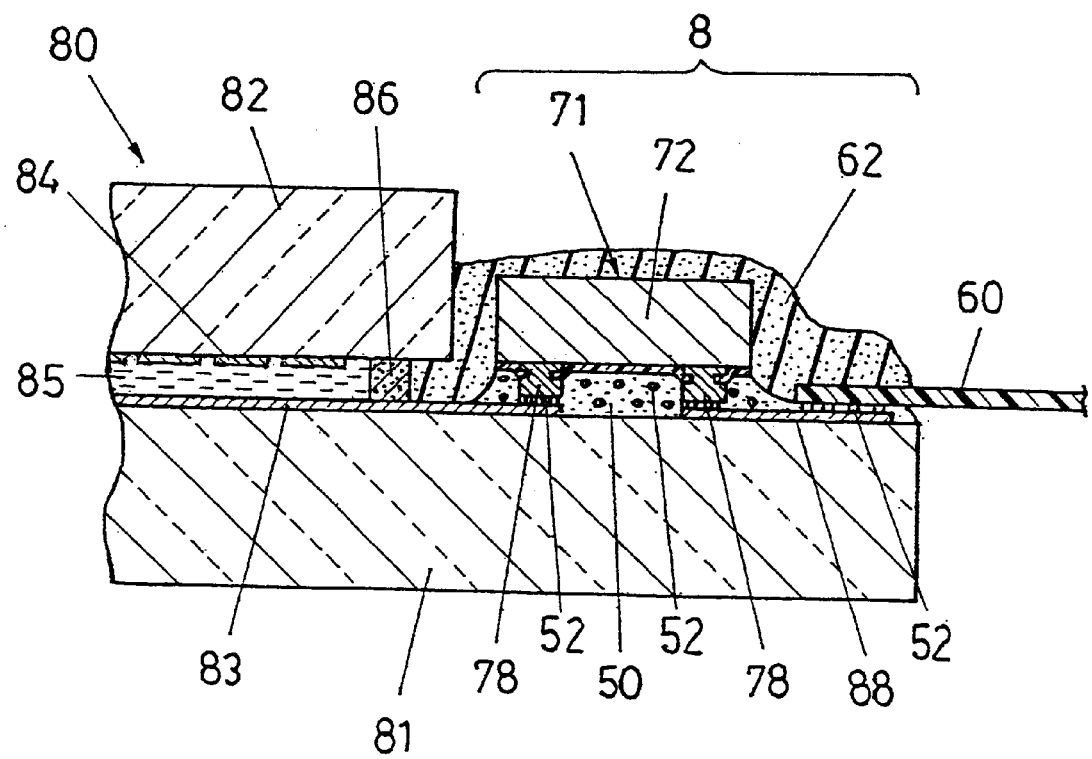
FIG. 16 is a sectional view showing an example of a conventional structure for mounting the semiconductor device on a liquid crystal display device.

Reference numeral 80 denotes a liquid crystal display device, and respective parts composing a liquid crystal display panel thereof, corresponding to those of the conventional liquid crystal display device shown in FIG. 16, are denoted by like reference numerals.

The semiconductor device 1 for driving the liquid crystal display device 80 is mounted on the liquid crystal display device 80 comprising a first substrate 81 that is a glass substrate provided with scanning electrodes 83 formed thereon, a second substrate 82 that is a glass substrate provided with signal electrodes 84 formed thereon opposite to the scanning electrodes 83, and liquid crystal 85 sealed therein-between with a sealing material 86.

As described hereinbefore with reference to FIG. 2, the semiconductor device 1 is provided with the bumps 24 formed in such a way as to stretch over both the upper surface 12a of the semiconductor chip 12 with the integrated circuit formed thereon, and the first sidewall face 12b or the second sidewall face 12c.

With the semiconductor device 1 set up in a posture as shown in FIG. 1, a sidewall face on one side of the semiconductor chip 12 is opposite to, and mounted on a region (part) of the first substrate 81 of the liquid crystal display device 80 where the first substrate 81 is extended beyond an edge of the second substrate 82, and the bumps 24 shown on the lower side in the figure are connected to the scanning electrodes 83 formed on the first substrate 81, respectively.

An anisotropic conductive adhesive 50 composed of electrically conductive particles dispersed into an insulating adhesive is interposed between the respective bumps 24, and the respective scanning electrodes 83 on the first substrate 81, and thereafter heat treatment is applied therebetween while applying pressure to the semiconductor device 1 against the first substrate 81, thereby attaining electrical connection between the respective bumps 24 and the respective scanning electrodes 83 through the intermediary of the electrically conductive particles.

Further, an end of a flexible printed circuit board (FPC) 60 is pressed down to another sidewall face on the upper side of the semiconductor chip 1, as shown in the figure, and bonded thereto by the anisotropic conductive adhesive 50, thereby attaining electrical connection (conduction) between the respective bumps 24 disposed on the upper side in the figure, and a wiring pattern formed on the FPC 60 through the intermediary of the electrically conductive particles of the anisotropic conductive adhesive 50.

For connection of the respective bumps 24 of the semiconductor device 1 with the respective scanning electrodes 83 on the first substrate 81 of the liquid crystal display device 80, and with the wiring pattern formed on the FPC 60, heat treatment at a temperature in the range of 180 to 220° C. is applied between the FPC 60 and the semiconductor device 1 as well as between the semiconductor device 1 and the first substrate 81 while applying pressure at 400 kg/cm² thereto, respectively.

Thereafter, a gap between the periphery of the semiconductor device 1, and the first and second substrates 81, 82, of the liquid crystal display device 80, respectively, and a gap between the periphery of the semiconductor device 1, and the FPC 60 are filled up, and covered with mold resin 65, thereby preventing moisture from ingressing into respective junctions, and providing the respective junctions with mechanical protection while ensuring that the semiconductor device 1, the liquid crystal display device 80, and the FPC 60 are solidly bonded together.

Thus, by electrically and mechanically connecting the sidewall face of the semiconductor chip 12 of the semiconductor device with the substrate of the liquid crystal display device and the electrodes formed thereon, an area required for mounting the semiconductor device on the substrate of the liquid crystal display device can be significantly reduced in comparison with that in the case of the conventional structure for mounting a semiconductor device, as shown in FIG. 16, so that nondisplay sections of a liquid crystal display panel are lessened in area, thereby enabling a liquid crystal display device to be downsized.

Method of Fabricating the Semiconductor Device: FIGS. 2 to 10

A method of fabricating the semiconductor device shown in FIG. 2, according to the invention, is next described with reference to FIGS. 3 to 10.

Figure 3:
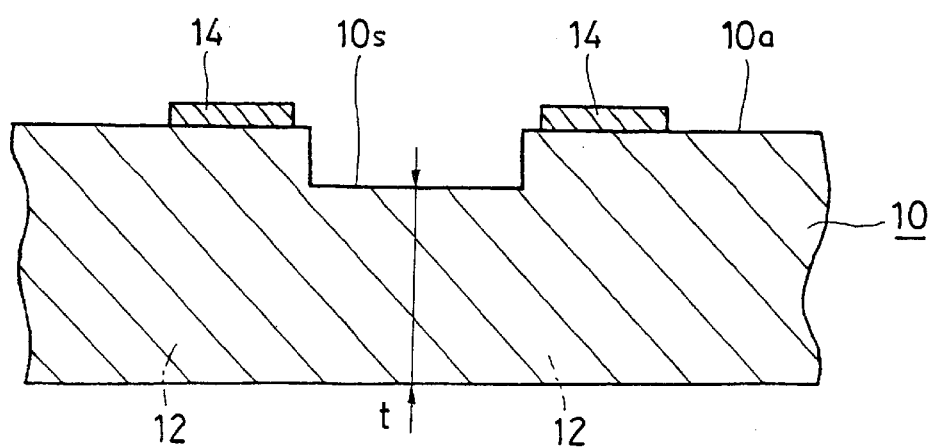
FIGS. 3 to 10 are sectional views showing respective steps of a method of fabricating the semiconductor device shown in FIG. 2.

As shown in FIG. 3, a first dicing (grooving) step is applied to a surface 10a of a semiconductor substrate (wafer) 10 provided with integrated circuits (not shown) for a multitude of semiconductor chips, and a multitude of electrode pads 14 placed in lines on the surface 10a thereof, thereby forming a street line 10s in the shape of a groove. The street line 10s is formed in the central region between respective lines of the electrode pads 14 for the semiconductor chips 12, 12 adjacent to each other and arranged in two lines, to a depth so as to leave out a thickness t of the semiconductor substrate 10, in the order of, for example, 200 to 300 μm.

The respective electrode pads 14 are made of aluminum and have the function of connecting a multitude of the integrated circuits for driving the liquid crystal display device, formed in the semiconductor substrate 10, with an external circuit, respectively.

Figure 4:
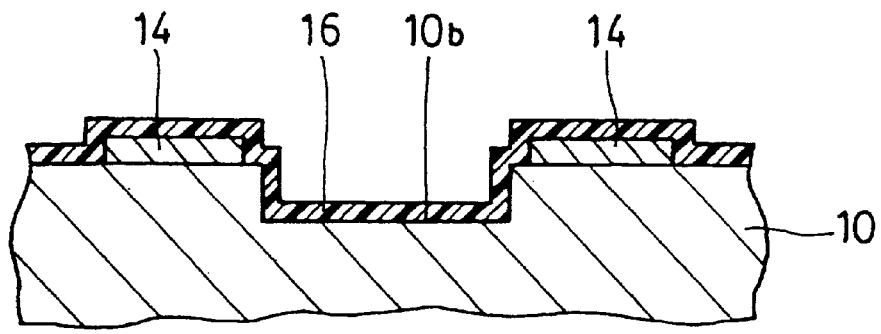

Subsequently, as shown in FIG. 4, an insulating film 16 made of a photosensitive polyimide is formed on the surface (upper surface) 10a of the semiconductor substrate 10, and on the entire inner surface of the street line 10s to a thickness in the range of 2 to 3 μm by the spin coater method. The insulating film 16 may be composed of a silicon oxide film containing boron and/or phosphorus, formed by the chemical vapor deposition (CVD) method, besides a photosensitive polyimide film, or may be composed of a silicon nitride film formed by the plasma CVD method.

Figure 5:
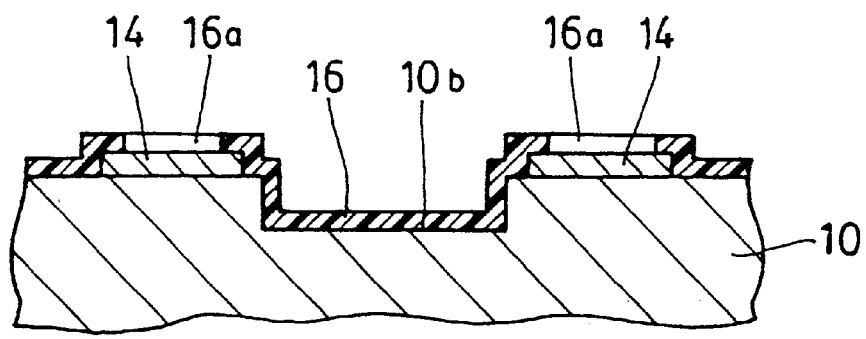

Thereafter, by applying exposure treatment to the insulating film 16 composed of the photosensitive polyimide film using a predetermined mask, and subsequently, by applying development treatment thereto, the insulating film 16 is patterned such that an opening 16a is formed, over the respective electrode pads 14, as shown in FIG. 5.

Figure 6:
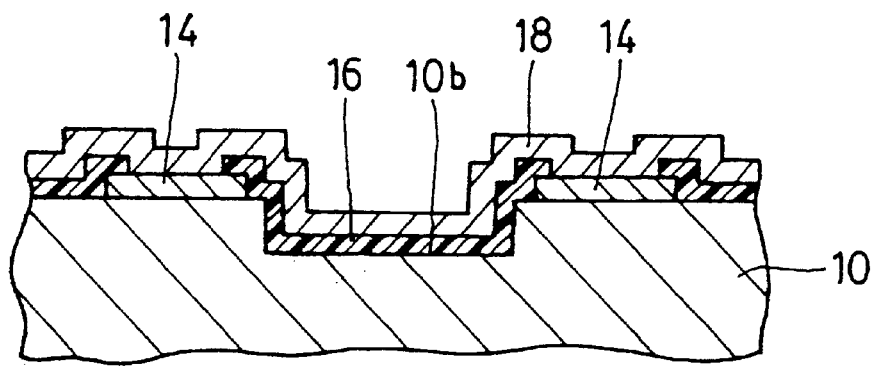

In a subsequent step, an aluminum film, a chromium film, and a copper film are formed in sequence by the sputtering method to a thickness of 0.8 μm, 0.01 μm, and 0.8 μm, respectively, on the entire upper surface of the semiconductor substrate 10 including the upper surface of the insulating film 16 and that of the respective electrode pads 14, thereby forming a common electrode film 18 of a triple-layer structure as shown in FIG. 6.

As a constituent material for the common electrode film 18, it is necessary to select a stable electrode material that has excellent electrical connection and mechanical adhesion with an electrode material used for forming the electrode pads 14 and the inner bumps 22 shown in FIG. 2, and that causes no mutual diffusion with the latter electrode material.

For this reason, besides the above-described triple-layer structure composed of aluminum, chromium, and copper, either a bi-layer structure composed of titanium and palladium, titanium and gold, titanium and platinum, titanium-tungsten alloy and palladium, titanium-tungsten alloy and gold, titanium-tungsten alloy and platinum, titanium-tungsten alloy and copper, chromium and copper, and so forth, or a triple-layer structure composed of aluminum, titanium, and copper is effective for the common electrode film 18.

In this connection, the uppermost layer of the common electrode film 18 is preferably made of copper because this will render it easier to form the bumps by plating as described later, and further, even if soldering is applied to the upper surface of copper, there will be no risk of copper melting into solder upon heating in this case.

Figure 7:
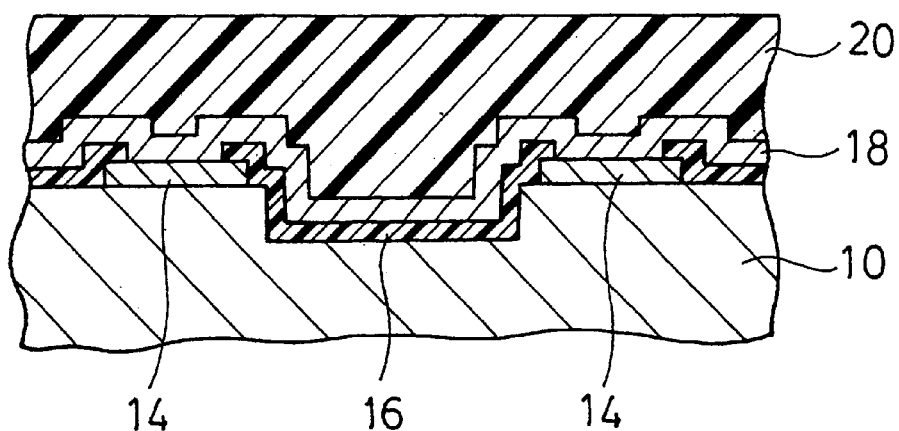

Subsequently, as shown in FIG. 7, a photosensitive resin 20 is formed over the entire upper surface of the common electrode film 18 in a thickness of 17 μm by the spin coater method. Further, after applying exposure treatment to the photosensitive resin 20 using a predetermined mask, development treatment is applied thereto, so that the photosensitive resin film 20 is patterned such that an opening is formed in respective regions where the respective bumps are to be formed (refer to FIG. 8).

Figure 8:
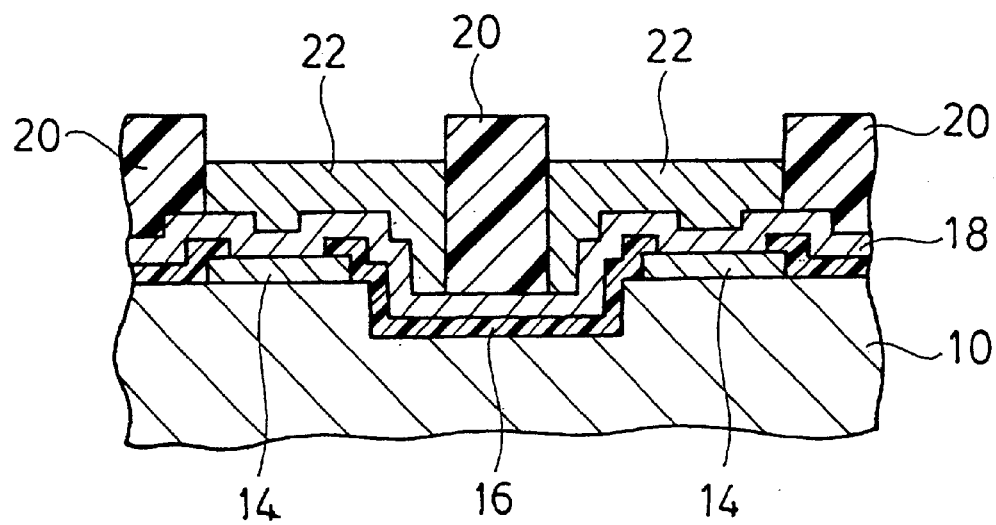

In a subsequent step, a copper plating is formed to a thickness ranging from 10 μm to 15 μm using the photosensitive resin film 20 as a plating mask, thereby forming the inner bump 22 composed of a copper plating layer on the common electrode film 18 inside the respective openings of the photosensitive resin 20 as shown in FIG. 8.

Further, as a constituent material for the inner bumps 22 formed at this point in time, gold or nickel may be used instead.

Figure 9:
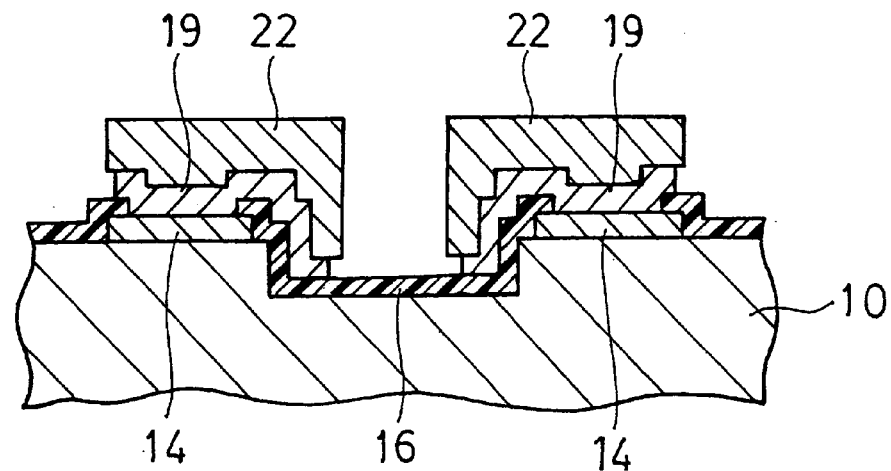
Figure 10:
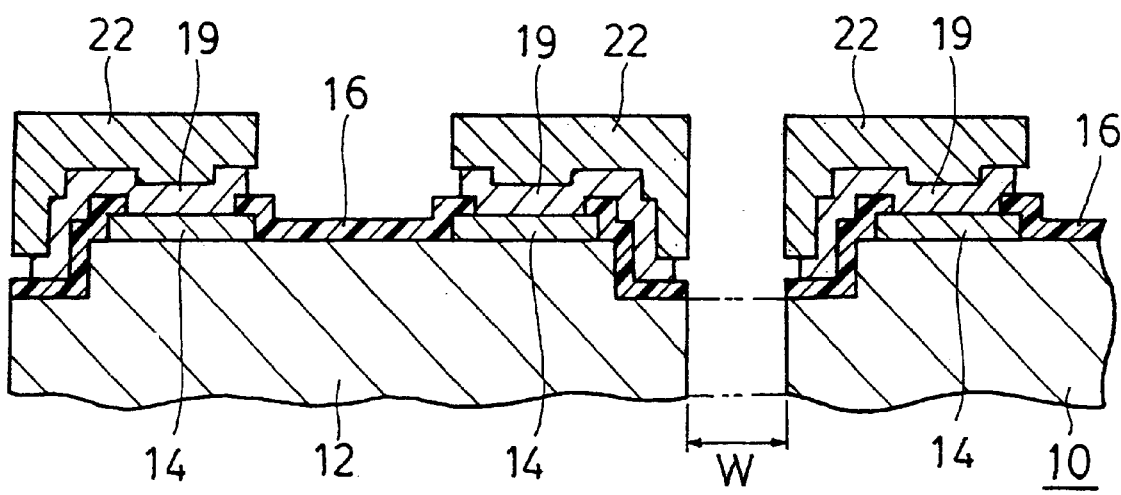

In a subsequent step, the photosensitive resin 20 that have been used as the plating mask is removed by use of a wet remover (refer to a FIG. 9). Thereafter, etching of copper is carried out using the inner bumps 22 as etching masks by use of "Enstrip C" (trade name) which is the etchant for copper, manufactured by Meltex Inc., thereby removing portions of copper which is the uppermost layer coating of the common electrode film 18, in regions exposed out of the respective inner bumps 22. Such an etching treatment is applied for the duration of an over-etching time, 30% longer than a just etching time.

Subsequently, the chromium film (an intermediate layer), serving as a barrier layer as well as an adhesion layer of the common electrode film 18, and the aluminum film (the bottom layer) of the common electrode film 18 are etched with a mixed liquid consisting of ammonium cerium nitrate, potassium ferricyanide, and sodium hydroxide. This etching treatment is also applied for the duration of an over-etching time, 30% longer than a just etching time.

Thus, by removing unnecessary portions of the common electrode film 18, a lower electrode 19 can be formed only in underlayer regions matching the respective inner bumps 22 as shown in FIG. 9.

Thereafter, in a second dicing step, a portion of the semiconductor substrate 10, underneath the street line 10s, the thickness of which has been rendered thinner in the first dicing step as described with reference to FIG. 3, is cut off, thereby cutting the semiconductor substrate 10 into individual semiconductor chips 12. The second dicing step is carried out with a dicing width W narrower to the extent in the range of 30 to 50 μm than that for the first dicing step.

Thereafter, the entire exposed surface of the respective inner bumps 22 of the respective semiconductor chips 12 is plated with gold to a thickness in the range of 2 to 3 μm by the electroless plating method, thereby forming an outer bump 24 as shown in FIG. 2.

In this connection, the outer bump 24 may have a bi-layer structure composed of nickel and gold.

After taking the steps described in the foregoing in sequence, the semiconductor device 1 is completed wherein, as shown in FIG. 2, a multitude of the bumps 24 are formed so as to stretch over both the upper surface 12a of the semiconductor chips 12 and the first sidewall face 12b as well as both the upper surface 12a and the second sidewall face 12c opposite from the first sidewall face 12b, respectively, and to be insulated from each other by the insulating film 16. Supplementary Description of the Semiconductor Device and the Structure for Mounting the Same: FIGS. 11 to 14

Now, supplementary description is given hereinafter on the semiconductor device 1 and the structure for mounting the same on a liquid crystal display device with reference to FIGS. 11 to 14.

Figure 11:
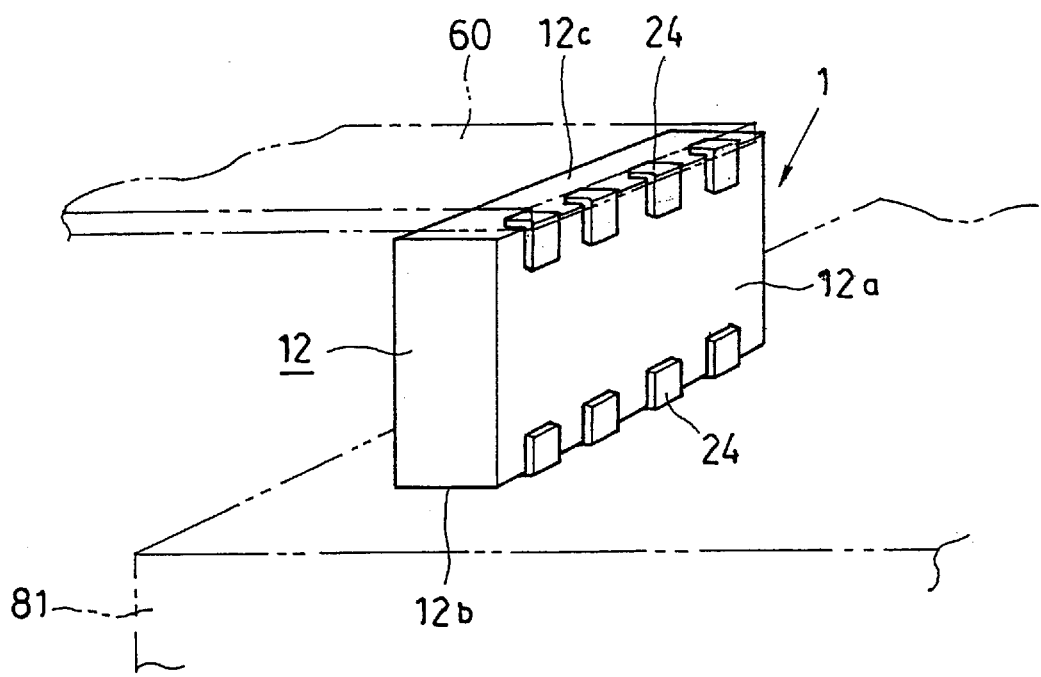
FIG. 11 is a perspective view showing an example of a relationship of the semiconductor device in the invention with a substrate of the liquid crystal display device, and with a FPC.

With the semiconductor device 1 shown in FIG. 2, a plurality of the bumps 24 formed so as to stretch over both the upper surface 12a of the semiconductor chip 12 and the first sidewall face 12b are placed in lines at a spacing across the longitudinal direction, and a plurality of the bumps 24 formed so as to stretch over both the surface 12a and the second sidewall face 12c are also placed in lines at a spacing across the longitudinal direction as shown in FIG. 11. The first sidewall face 12b and the second sidewall face 12c are respective sidewall faces on opposite sides of the semiconductor chip 12, parallel to each other.

In this case, as shown in FIG. 11, the semiconductor device 1 is mounted on the upper surface of the first substrate 81 of the liquid crystal display device such that the first sidewall face 12b of the semiconductor chip 12 is opposite thereto and an end portion of the FPC 60 is connected with the second sidewall face 12c. In FIG. 11, the first substrate 81 and the FPC 60 are indicated by phantom lines.

Figure 12:
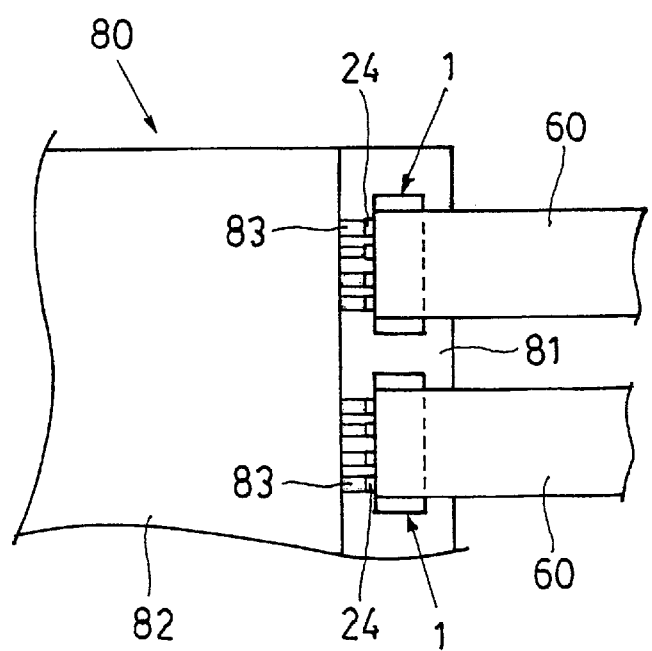
FIG. 12 is a plan view showing a part of the liquid crystal display device shown in FIG. 11 with the semiconductor device mounted thereon, and with the FPCs connected thereto.

FIG. 12 is a plan view showing a part of the liquid crystal display device 80 wherein the semiconductor devices 1 are mounted, and the FPC 60 is connected to the respective semiconductor devices 1.

Figure 13:
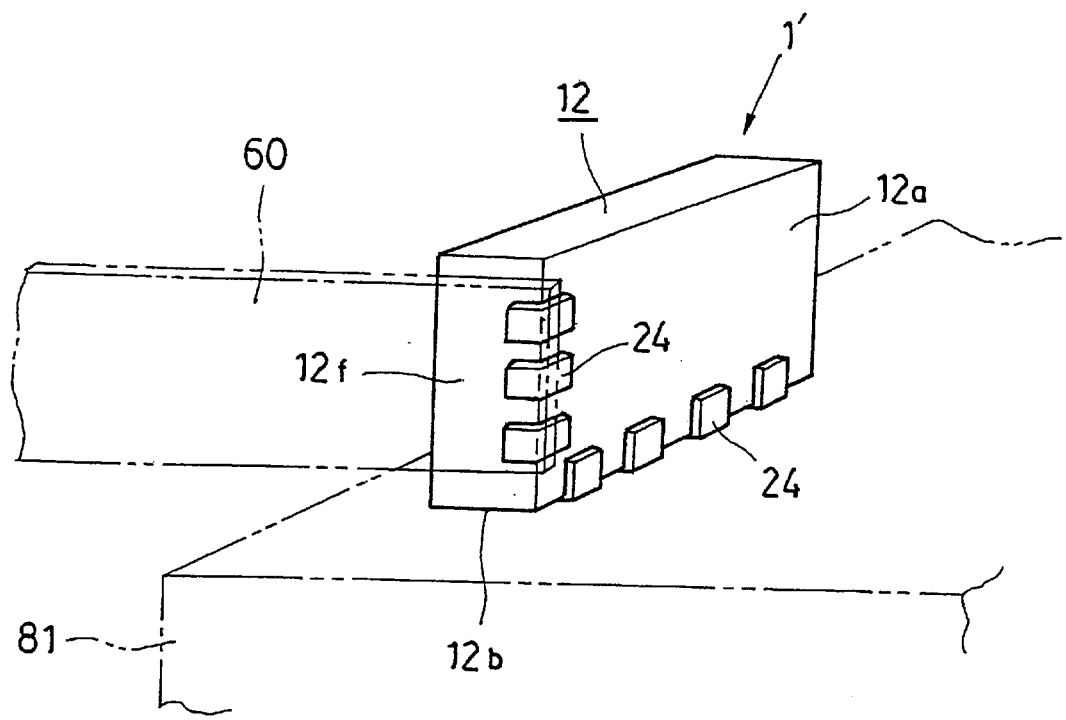
FIG. 13 is a perspective view showing another example of a relationship of the semiconductor device in the invention with the substrate of the liquid crystal display device, and with the FPC.
Figure 14:
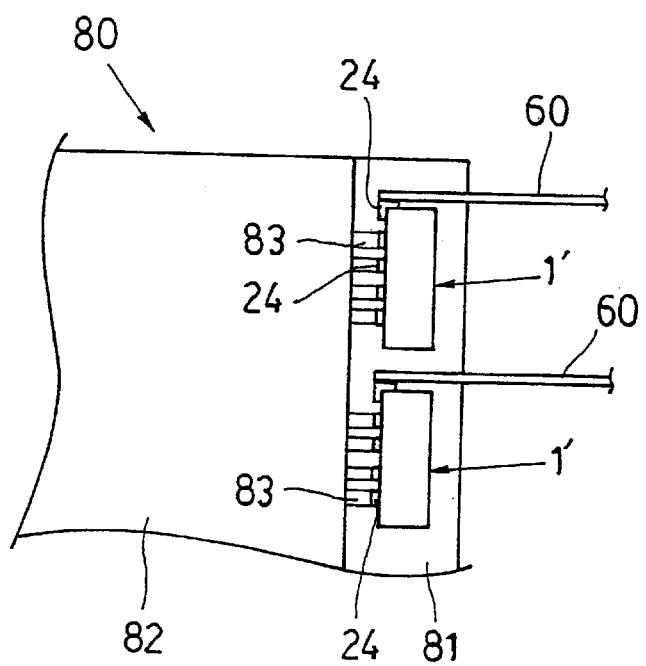
FIG. 14 is a plan view showing a part of the liquid crystal display device shown in FIG. 13 with the semiconductor device mounted thereon, and the FPCs connected thereto.
Figure 15:
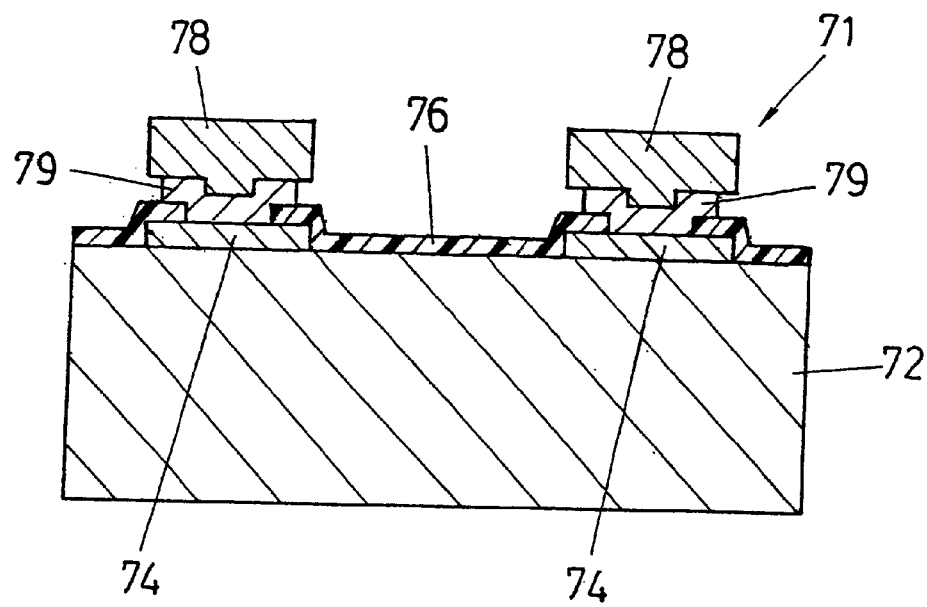
FIG. 15 is a sectional view showing an example of a conventional semiconductor device provided with bumps.

FIGS. 13 and 14 are views similar to FIGS. 11 and 12, showing another embodiment of the invention, different from the previously described embodiment, by way of example.

With a semiconductor device 1' according to this example, bumps 24 are provided so as to stretch over both the upper surface 12a of a semiconductor chip 12 and a first sidewall face 12b, and other bumps 24 are also provided so as to stretch over both the upper surface 12a of the semiconductor chip 12 and a third sidewall face 12f of the semiconductor chip 12, orthogonal to the first sidewall face 12b. In other respects, the semiconductor device 1' is the same in construction as the semiconductor device 1 shown in FIG. 2.

As shown in FIGS. 13 and 14, in mounting the semiconductor device 1' on the liquid crystal display device, the semiconductor device 1' is mounted on the upper surface of a portion of the first substrate 81 of the liquid crystal display device 80, extending beyond an edge of the second substrate 82 thereof, such that the first sidewall face 12b of the semiconductor chip 12 is opposite thereto, thereby connecting the respective outer bumps 24 stretching over the first sidewall face 12b with respective scanning electrodes 83 on the first substrate 81. Further, the flexible printed circuit board (FPC) 60 is connected to the third sidewall face 12f of the semiconductor chip 12 of the respective semiconductor device 1', thereby causing the respective outer bumps 24 provided to stretch over the third sidewall face 12f to be electrically conductive with a printed wiring of the FPC 60.

The construction as described above results in a decrease in the dimensions of the liquid crystal display device, thicknesswise, and this is advantageous in fabricating a flat-type liquid crystal display device.

With each of the previously-described embodiments, the semiconductor device is mounted on the first substrate of the liquid crystal display device, with the scanning electrodes formed thereon, but the same may be mounted on the second substrate thereof in case that the second substrate with the signal electrodes formed thereon is extended beyond an edge of the first substrate. Further, semiconductor devices to be connected with the scanning electrodes may be mounted on the first substrate while semiconductor devices to be connected with the signal electrodes may be mounted on the second substrate. Furthermore, there may be a case where the scanning electrodes and the signal electrodes are installed in a reversed position, respectively, or serve as display electrodes or data electrodes and opposite electrodes, respectively.

INDUSTRIAL APPLICABILITY

As is evident from the foregoing description, with the structure for mounting the semiconductor device on the liquid crystal display device, and the semiconductor device for implementing the same, according to the invention, the semiconductor device for driving the liquid crystal display device is provided with the bumps formed so as to stretch over both the upper surface and the sidewall faces of the semiconductor chip, so that connection of the semiconductor chip with the circuit board of the liquid crystal display device, and the flexible printed circuit board for providing the semiconductor device with a power supply source and signals is effected on the sidewall faces of the semiconductor chip, respectively. Accordingly, an area of junctions can be downsized, and further, connection can be rendered highly reliable.

As a result, it becomes possible to realize high density mounting of semiconductor devices on a liquid crystal display device, thereby achieving downsizing of the liquid crystal display device.

What is claimed is:

1. A structure for mounting a semiconductor device on a liquid crystal display device for driving the liquid crystal display device comprising a first substrate provided with scanning electrodes formed thereon, a second substrate provided with signal electrodes formed thereon, opposite to the scanning electrodes, and liquid crystal sealed therein-between, wherein said semiconductor device is provided with bumps electrically conductive with electrode pads formed on a semiconductor chip with an integrated circuit formed thereon, respectively, through an intermediary of respective lower electrodes, formed so as to stretch over both an upper surface and a sidewall face of the semiconductor chip, and said semiconductor device is mounted on a surface of a part of either the first substrate and the second substrate, where one of said substrates is extended beyond an edge of the other substrate, such that the sidewall face on one side of the semiconductor chip is opposite to said surface, so that the bumps disposed on said one side are connected to the electrodes formed on one of said substrates, respectively.

2. A structure for mounting a semiconductor device on the liquid crystal display device according to claim 1, wherein the bumps of said semiconductor device are provided so as to stretch over both the upper surface and a second sidewall face of the semiconductor chip opposite from a first sidewall face of the semiconductor chip as well as both the upper surface and the first sidewall face, and said semiconductor device is mounted on the surface of a part of either the first substrate and the second substrate, where one of said substrates is extended beyond an edge of the other substrate, such that the first sidewall face of the semiconductor chip is opposite to said surface, so that the bumps stretching over the first sidewall face are connected to the electrodes formed on said one of the substrates, respectively, while a flexible printed circuit board is connected to the second sidewall face of the semiconductor chip, so that a printed wiring of the flexible printed circuit board is rendered electrically conductive with the bumps stretching over the second sidewall face.

3. A structure for mounting a semiconductor device on the liquid crystal display device according to claim 1, wherein the bumps of said semiconductor device are provided so as to stretch over both the upper surface and a third sidewall face of the semiconductor chip orthogonal to a first sidewall face of the semiconductor chip as well as both the upper surface and the first sidewall face, and said semiconductor device is mounted on the surface of a part of either the first substrate and the second substrate, where one of said substrates is extended beyond an edge of the other substrate, such that the first sidewall face of the semiconductor chip is opposite to said surface, so that the bumps stretching over the first sidewall face are connected to the electrodes formed on said one of the substrates, respectively, while a flexible printed circuit board is connected to the third sidewall face of the semiconductor chip, so that a printed wiring of the flexible printed circuit board is rendered electrically conductive with the bumps stretching over the third sidewall face.

4. A semiconductor device mounted on a liquid crystal display device comprising a first substrate provided with scanning electrodes formed thereon, a second substrate provided with signal electrodes formed thereon opposite to the scanning electrode, and liquid crystals sealed therein-between, for driving the liquid crystal display device;

said semiconductor device comprising: a semiconductor chip provided with an integrated circuit formed thereon, and electrode pads for connecting the integrated circuit to an external circuit, disposed in the vicinity of side edges of the upper surface thereof; an insulating film formed on the semiconductor chip, having an opening for exposing the respective electrode pads; a lower electrode provided on the respective electrode pads; and a plurality of bumps, each electrically conductive with the respective electrode pads through the intermediary of the respective lower electrodes, provided so as to stretch over both the upper surface and respective sidewall faces of the semiconductor chip.

5. A semiconductor device according to claim 4, wherein the sidewall faces of the semiconductor chip, along which the bumps are provided, respectively, are formed in a setback shape with a difference in level, provided on the side of the upper surface of the semiconductor chip.

6. A semiconductor device according to claim 4, wherein the bumps are provided so as to protrude sideways from the respective sidewall faces of the semiconductor chip.

7. A semiconductor device according to claim 5, wherein the bumps are provided so as to protrude sideways from an outermost face of the respective sidewall faces having the difference in level, of the semiconductor chip.

8. A semiconductor device according to claim 4, wherein the bumps are composed of a plurality of metallic layers.

9. A semiconductor device according to claim 6, wherein the bumps are composed of a plurality of metallic layers.

10. A semiconductor device according to claim 7, wherein the bumps are composed of a plurality of metallic layers.

* * * * *

UNITED STATES PATENT AND TRADEMARK OFFICE
CERTIFICATE OF CORRECTION

PATENT NO. : 6,339,247 B1
DATED : January 15, 2002
INVENTOR(S) : Noboru Taguchi

It is certified that error appears in the above-identified patent and that said Letters Patent is hereby corrected as shown below:

<u>Title page,</u>
Item [54], change "STRUCTURE FOR MOUNTING A SEMICONDUCTOR DEVICE ON A LIQUID CRYSTAL DISPLAY, AND SEMICONDUCTOR DEVICE" to be -- STRUCTURE FOR MOUNTING A SEMICONDUCTOR DEVICE ON A LIQUID CRYSTAL DISPLAY DEVICE, AND SEMICONDUCTOR DEVICE FOR IMPLEMENTING SAME --

Signed and Sealed this

Seventeenth Day of September, 2002

*Attest:*

*Attesting Officer*

JAMES E. ROGAN
*Director of the United States Patent and Trademark Office*